United States Patent [19]

Ohms et al.

[11] Patent Number: 4,607,210

[45] Date of Patent: Aug. 19, 1986

[54] POTENTIAL FREE ACTUATION CIRCUIT FOR A PULSE DURATION CONTROLLED ELECTRONIC POWER SWITCH

[75] Inventors: Franz Ohms, Stuttgart; Günter Urbanski, Auenwald, both of Fed. Rep. of Germany

[73] Assignee: ANT Nachrichtentechnik GmbH, Backnang, Fed. Rep. of Germany

[21] Appl. No.: 526,536

[22] Filed: Aug. 25, 1983

[30] Foreign Application Priority Data

Aug. 26, 1982 [DE] Fed. Rep. of Germany ....... 3231788

[51] Int. Cl.$^4$ .............................................. G05F 1/56
[52] U.S. Cl. ..................... 323/290; 307/570; 307/571; 323/351
[58] Field of Search ............... 323/282, 289, 290, 351; 307/240, 570, 571, 573

[56] References Cited

U.S. PATENT DOCUMENTS

| 4,052,623 | 10/1977 | Loberg | 307/571 |
| 4,423,341 | 12/1983 | Shelly | 307/570 |
| 4,461,966 | 7/1984 | Hebenstreit | 307/571 |

FOREIGN PATENT DOCUMENTS

| 3045771 | 7/1982 | Fed. Rep. of Germany . | |
| 112111 | 7/1983 | Japan | 323/282 |

OTHER PUBLICATIONS

Joachim Wüstenhube, Schaltnetzteile [Switching Network Components], published by Expert Verlag, Grafenau, 1979, at p. 410, FIGS. 11.14.
Klaus Rischmüller, an article from the German publication ETZ-B, vol. 29, Issue 7, entitled "Treiberschaltung für Hochstromtransistoren", 1977, pp. 211-214.
Rainer von Courbiere, an article from the German publication ETZ-B, vol. 30, Issue 21, entitled "Zwei-Quadrant-Steller als Netzfreundliches Batterieladegerät", 1978, pp. 825-827.

Primary Examiner—William H. Beha, Jr.
Attorney, Agent, or Firm—Spencer & Frank

[57] ABSTRACT

A potential free actuation circuit for a pulse duration controlled electronic power switch having a control electrode and two major electrodes, the circuit including a driver stage having a control input and two major electrodes, and a pulse transformer connected for supplying control pulses to the driver stage for turning the power switch on and off. The driver stage and pulse transformer are connected and operated so that when the power switch is being turned off, its control electrode is placed at the potential of one of its major electrodes to thereby achieve greater freedom from disturbance, and so that the power switch is actuated with very low resistance by the driver stage, resulting in very short switching times which lead to low switching losses.

9 Claims, 10 Drawing Figures

POTENTIAL FREE ACTUATION CIRCUIT FOR A PULSE DURATION CONTROLLED ELECTRONIC POWER SWITCH

BACKGROUND OF THE INVENTION

The present invention relates to a potential free actuation circuit for a pulse duration controlled electronic power switch employing a driver stage and at least one pulse transformer whose primary winding is connected to the output of a pulse duration modulation stage. Such an actuation circuit is described, for example, by J. Wüstehube in Schaltnetzteile [Switching Network Components], published by Expert Verlag, Grafenau, 1979, at page 410, FIGS. 11.14.

Actuation circuits for electronic power switches, particularly MOS power switches, must be actuated without potential if there is a separation between the primary and secondary circuits. This should usually be effected with the least possible number of components and with good efficiency.

Potential free will means that there is no DC coupling between pulse duration stage and the driver stage of the electronic power switch and that there is an insulation between these two stages. Such a potential free actuation can be realised by using a pulse transformer.

SUMMARY OF THE INVENTION

It is an object of the present invention to provide an actuation circuit of the above-mentioned type which provides short switching times and assures high freedom from disturbance with respect to transient turn-on and turn-off.

The above and othe objects are achieved according to the present invention, by the provision of a potential free actuation circit for a pulse duration controlled electronic power switch having two major electrodes, said circuit comprising: a driver stage having a control input and two major electrodes; at least one pulse transformer having a primary winding and a secondary winding; a pulse duration modulation stage having an output connected to the primary winding; a first rectifier element connected between the secondary winding and the control input of the driver stage; a second rectifier element connected between the side of the first element which is remote from the secondary winding and a major electrode of the driver stage; and a charging capacitor connected between the side of the second rectifier element facing away from the first rectifier element and a major electrode of the power switch, with the first and second rectifier elements being poled in the same direction with respect to current flow through the first element.

After turning off the power transistor, the control input of the power switch is placed at the potential of a major electrode, thus realizing greater freedom from disturbance, or interference. By designing the driver stage according to further features of the invention, it is assured that the power switch is actuated with very low resistance. With actuation circuits according to additional features of the invention, it is possible to realize keying ratios $$\left( = \frac{\text{on time}}{\text{period duration}} \right)$$

from 0 to 1 for the power switch.

Additional features of the invention make possible symmetrical actuation of the driver stage.

Finally, the invention makes it possible to use the demagnetization current of the pulse transformer(s) for recharging the charging capacitor (or capacitors) and thus to increase efficiency.

The present invention will now be explained in greater detail with reference to the drawings.

BRIEF DESCRIPTION OF THE DRAWING

FIGS. 1–10 are all circuit diagrams of embodiments of actuation circuits according to the invention.

DESCRIPTION OF THE PREFERRED EMBODIMENTS

Figure 1:
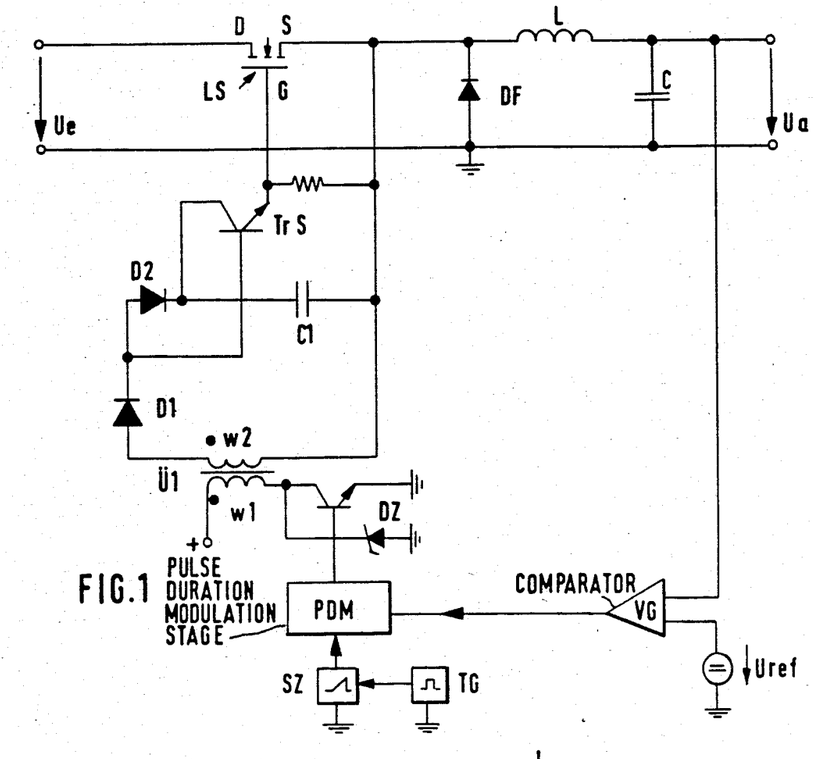
FIG. 1 shows an actuation circuit including an n-channel MOSFET as power switch.

FIG. 1 shows an actuation circuit according to the present invention for the exemplary use in a direct voltage, low set, switch controller. Between the input terminals of the circuit there is applied the input voltage Ue of the switch controller. The electronic power switch LS is constituted by an n-channel MOS field effect transistor. Its drain electrode D is connected to the input terminal which carries a positive potential. The source electrode S is connected, via a smoothing choke L, to the positive potential output terminal of the switch controller. At the connection point between source electrode S and smoothing choke L, there is connected an idling diode DF. A charging capacitor C is connected in parallel with the output terminals of the switch controller. The output voltage potential Ua is obtained at the positive potential output terminal and is compared in a comparison stage VG with a reference voltage potential Uref.

The output signal of the comparison stage VG is fed to a pulse duration modulation stage PDM. The pulse duration modulation stage PDM is controlled by a sawtooth generator SZ which is synchronized by a clock pulse generator TG. The monolithically integrated circuit TDA 1060 is particularly suitable for the pulse duration modulation stage since it already contains the component groups PDM, SZ and TG.

The output of the pulse duration modulation stage PDM is connected, via a driver transistor, with the primary winding w1 of the pulse transformer Ü1. A Zener diode DZ connected to the primary winding w1 permits demagnetization of the pulse transformer Ü1. One end of the secondary winding w2 of this pulse transformer is connected, via a first rectifier element D1, with the control input, i.e. the base, of driver stage transistor TrS as well as, via a second rectifier element D2, with a major electrode, specifically the collector, of this driver stage TrS. The rectifier elements D1 and D2 are poled in the same sense with respect to the direction of current flow.

The cathode of rectifier element D2 is connected with the collector of driver stage TrS and with a first terminal of charging capacitor C1. The other terminal of charging capacitor C1 is connected with the source electrode S of power switch LS, with the outer winding end of the secondary w2 of the pulse transformer and, via a resistor, with the other major electrode, specifically the emitter, of driver stage TrS. This latter major electrode is also connected to the gate terminal G of power switch LS. Since power switch LS in FIG. 1 is composed of an n-channel MOS field effect transistor, an npn transistor is used for driver stage TrS.

The actuation circuit according to the present invention operates as follows:

If a pulse is transmitted by pulse duration modulation stage PDM to the secondary w2, a current flows via D1 in the first moment, which is during the rise time of this pulse, to the base of driver stage TrS. The driver stage is now fully driven and power switch LS is controlled to be conductive through its gate terminal. Once driver stage TrS is fully driven, charging capacitor C1 is charged by the current through rectifier elements D1 and D2. At the end of the pulse from stage PDM, driver stage TrS is blocked. A cleaning current flows from gate electrode G of power switch LS through the emitter resistor of driver stage TrS. At the end of this current flow, power switch LS is blocked until a new pulse from pulse duration modulation stage PDM turns it on again via the now again driven driver stage TrS.

The cleaning current is a discharge current of the gate-source capacitance of the MOS field effect transistor used as power switch LS. This current will flow during turn off of the MOS field effect transistor.

Figure 2:
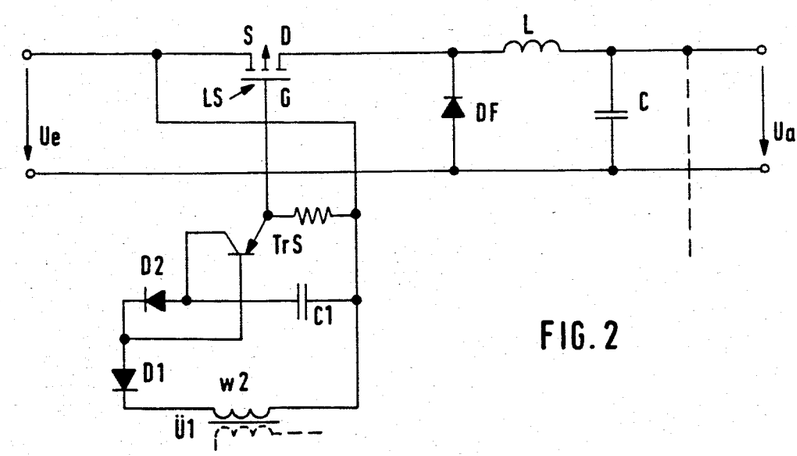
FIG. 2 shows an actuation circuit including a p-channel MOSFET as power switch.

The actuation circuit according to FIG. 2 has a similar construction as that of FIG. 1. However, power switch LS is a p-channel MOS field effect transistor. Consequently, driver stage TrS is a pnp transistor. Rectifier diode D2 has its anode connected to the collector of driver stage transistor TrS and diodes D1 and D2 are poled oppositely to the arrangement of FIG. 1.

Figure 3:
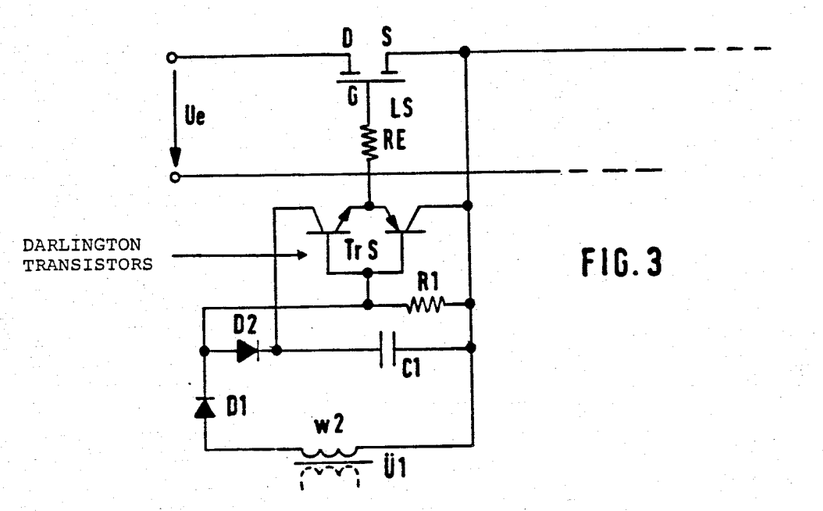
FIG. 3 shows an actuation circuit including a driver stage in push-pull connection.

The actuation circuit according to FIG. 3 is of similar construction. Driver stage TrS here includes a push-pull stage in emitter follower connection with bipolar transistors of mutually opposite polarities. The emitters of these transistors are connected, via a common emitter resistor RE, with the gate terminal G of power switch LS. The two base electrodes of the push-pull transistors are connected together and lead, via a resistor R1, to the common connection point of charging capacitor C1 and source electrode S of power switch LS. In this embodiment, the cleaning current of power switch LS flows from gate electrode G via the emitter base path of the transistor of stage TrS, whose collector is connected to source electrode S through the base resistor R1. Part of the cleaning current also flows off through the emitter-collector path of this transistor. At the end of a pulse, the gate electrode G of LS is at source potential with low resistance. This produces high resistance to interference with respect to transient turn-on or turn-off.

The power switch LS is actuated with very low resistance by the push-pull driver stage TrS. This results in very short switching times which again lead to low switching losses. The push-pull driver stage can also be realized with Darlington transistor stages of inverse types, meaning stages of Darlington transistors of mutually opposite polarities (npn or pnp) or with small signal MOS field effect transistors also of inverse types, meaning e.g. p-channel or n-channel MOS field effect transistors. Moreover, the actuation circuit including the push-pull driver stage TrS can be modified for use in a p-channel MOS field effect transistor as for the power switch.

All embodiments described below for n-channel MOS field effect transistors as power switches LS according to FIGS. 4 through 9 can be modified for p-channel MOS field effect transistors. Likewise, single or push-pull circuits can be used as the driver stage TrS in the above-mentioned embodiments.

Figure 4:
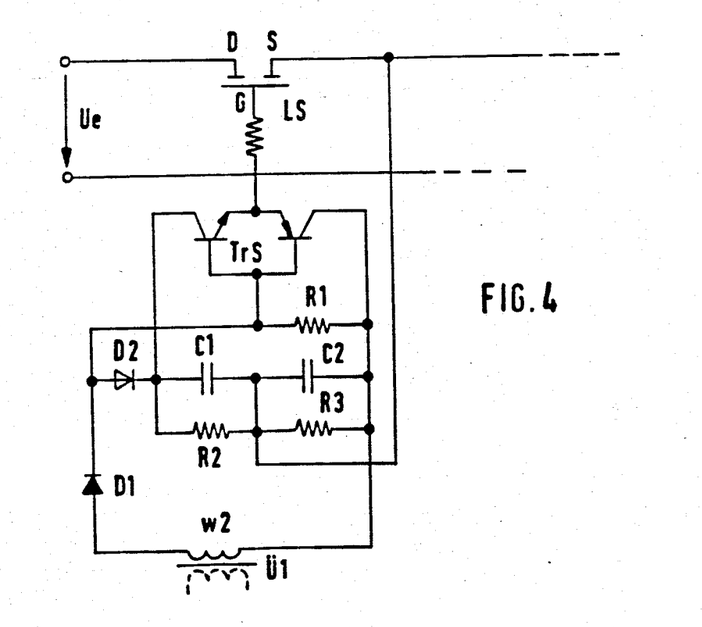
FIG. 4 shows an actuation circuit with symmetrical operation of the driver stage.

FIG. 4 shows an embodiment of similar construction to those described above but with symmetrical operation of driver stage TrS. A further charging capacitor C2 is connected in series with charging capacitor C1. Its terminal facing away from charging capacitor C1 is connected to the common connection point of base resistor R1 and the collector of the right-hand transistor of the push-pull driver stage TrS. The source electrode S of power switch LS is connected to the common connection point of the two charging capacitors C1 and C2. Both charging capacitors C1 and C2 are bridged by voltage divider elements, resistors R2 and R3, to be able to uniformly set the charging voltage in charging capacitors C1 and C2. Instead of resistors R2 and R3 as voltage divider elements, Zener diodes can also be used. In the embodiment of FIG. 4, the gate electrode G of power switch LS lies with low resistance at a negative potential with respect to source electrode S. This provides increased resistance to interference compared to the embodiment of FIG. 3 with respect to transient turn-on or turn-off.

The evaluation of the output voltage Ua by means of comparator VG as well as the provision of the pulse duration modulation stage PDM in the embodiments according to FIGS. 2 to 4 correspond to the circuit components of FIG. 1.

Figure 5:
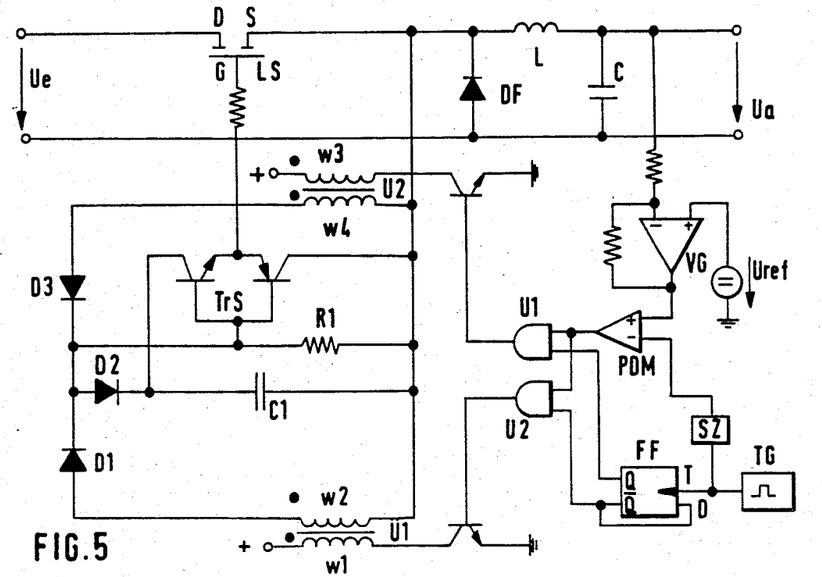
FIG. 5 shows an actuation circuit including two pulse transformers.

FIG. 5 shows an actuation circuit based on the embodiment of FIG. 3. In modification of FIG. 3, the circuit of FIG. 5 includes a further pulse transformer Ü2 which is actuated via a switching logic including two AND gates U1, U2 as well as a flip-flop FF, by the pulse duration modulation stage PDM with pulses which are shifted in phase by 180° with respect to those applied to the first pulse transformer Ü1. The pulse duration modulation stage PDM here includes an operational amplifier whose non-inverting input receives the output signal of comparison stage VG and whose inverting input receives the output signal of sawtooth generator SZ synchronized by clock pulse generator TG.

The 180° phase shifted pulses are provided by the action of AND gates U1 and U2 and flip-flop FF. The clock pulse input T of D-flip-flop FF receives the output signal from clock pulse generator TG. The D-input of flip-flop FF is connected to its inverting output $\bar{Q}$. The noninverting output Q of flip-flop FF, as well as the output of pulse duration modulator PDM are connected to the inputs of AND gate U1. AND gate U2 has its inputs connected to the inverting output $\bar{Q}$ of D-flipflop FF and to the output of pulse duration modulator PDM. The outputs of the AND gates are each connected, via a respective driver transistor, with one primary winding w1 or w3 of a respective pulse transformer Ü1 or Ü 2. The secondary winding w2 of the first pulse transformer Ü1 is connected to the actuation circuit as in FIG. 3. The secondary winding w4 of the second pulse transformer Ü2 is connected, via a third rectifier element D3, with the cathode of the first rectifier element D1 facing away from the pulse transformer Ü1. The third rectifier element D3 is connected with its cathode side to the cathode of the first rectifier element D1 facing away from the pulse transformer. By means of the 180° phase shifted pulses, power switch LS can be switched on with a keying ratio $$\left( = \frac{\text{turn-on time}}{\text{period duration}} \right)$$

of from 0 to 1.

Figure 6:
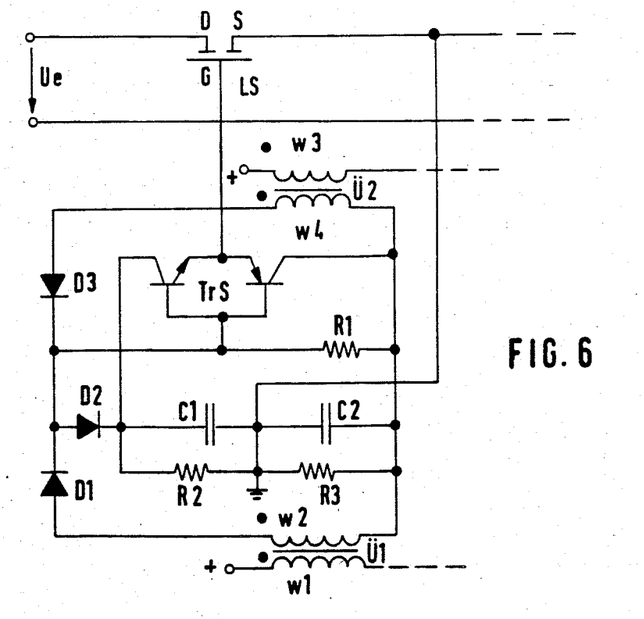
FIG. 6 shows an actuation circuit including two pulse transformers and symmetrical operation of the driver stage.

FIG. 6 shows an embodiment of the invention like that of FIG. 5 but with symmetrical actuation of driver stage TrS. For this purpose, two charging capacitors C1 and C2 are connected in series, as in FIG. 4, and the source terminal S is connected to the common connection point between these two charging capacitors C1 and C2.

Figure 7:
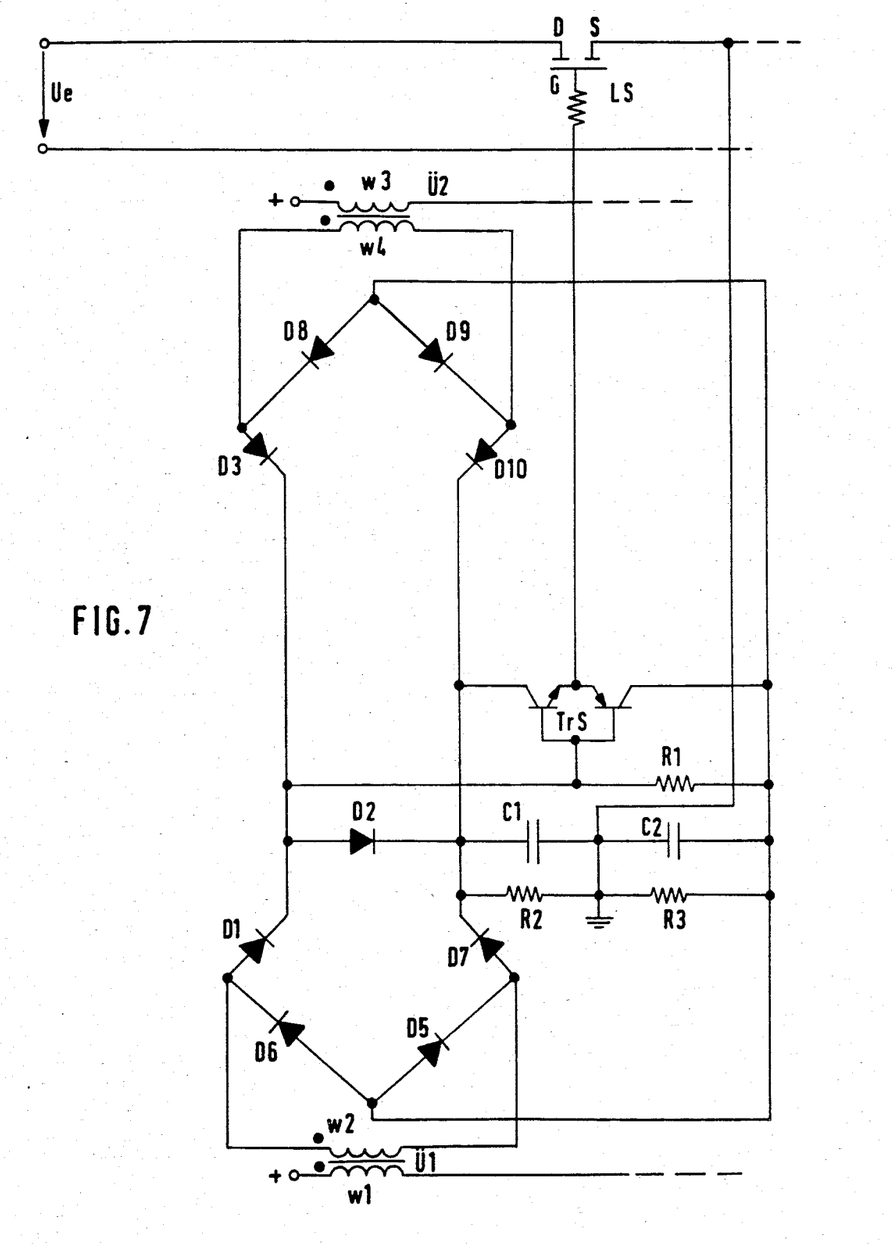
FIG. 7 shows an actuation circuit which utilizes demagnetization energy.

FIG. 7, like FIG. 5, has two pulse transformers Ü1 and Ü2, which are again actuated via the switching logic, as in FIG. 5, by two 180° phase shifted pulses. Moreover, as in FIG. 6, driver stage TrS is operated symmetrically by means of two charging capacitors C1 and C2. In contradistinction to FIG. 6, the embodiment according to FIG. 7 is additionally provided with rectifier elements D5 to D10 for recharging the charging capacitors C1 and C2 by means of the demagnetization currents of the two pulse transformers Ü1 and Ü2.

To feed back the demagnetization energy of the first pulse transformer Ü1, the anode of D1 is connected with the cathode of D6. The anode of D6 is connected with the anode of D5 and with that terminal of the second charging capacitor C2 which is not connected to the first charging capacitor C1. The cathode of D5 is connected with the anode of D7 and with the end of the secondary winding w2 of Ü1 facing away from the first rectifier element D1. Finally, the cathode of D7 is connected to the common connection points of D2 and C1. To feed back the demagnetization energy of the second pulse transformer Ü2 to the charging capacitors C1 and C2, the additional rectifier elements D8, D9 and D10 are provided. The cathode of D8 is connected with the anode of D3. D9 and D10 are connected in the same manner as their corresponding rectifier elements D5 and D7, but with respect to the secondary winding w4 and to rectifier element D8 which in its function corresponds to rectifier element D6 for secondary winding w2. The path for the demagnetization current of pulse transformer Ü1 will be outlined briefly: the demagnetization current flows through element D7, from the winding end w2 facing away from the first rectifier element D1, charging capacitors C1 and C2, and then through rectifier element D6 back to the left-hand side of secondary winding w2. Correspondingly, the demagnetization current of pulse transformer Ü2 flows through D10, C1 and C2 and D8.

All above-mentioned embodiments as well as the embodiments to be described below can be supplemented to provide for feeding back the demagnetization energy of the pulse transformer(s) to the charging capacitor(s).

Figures 8, 9:
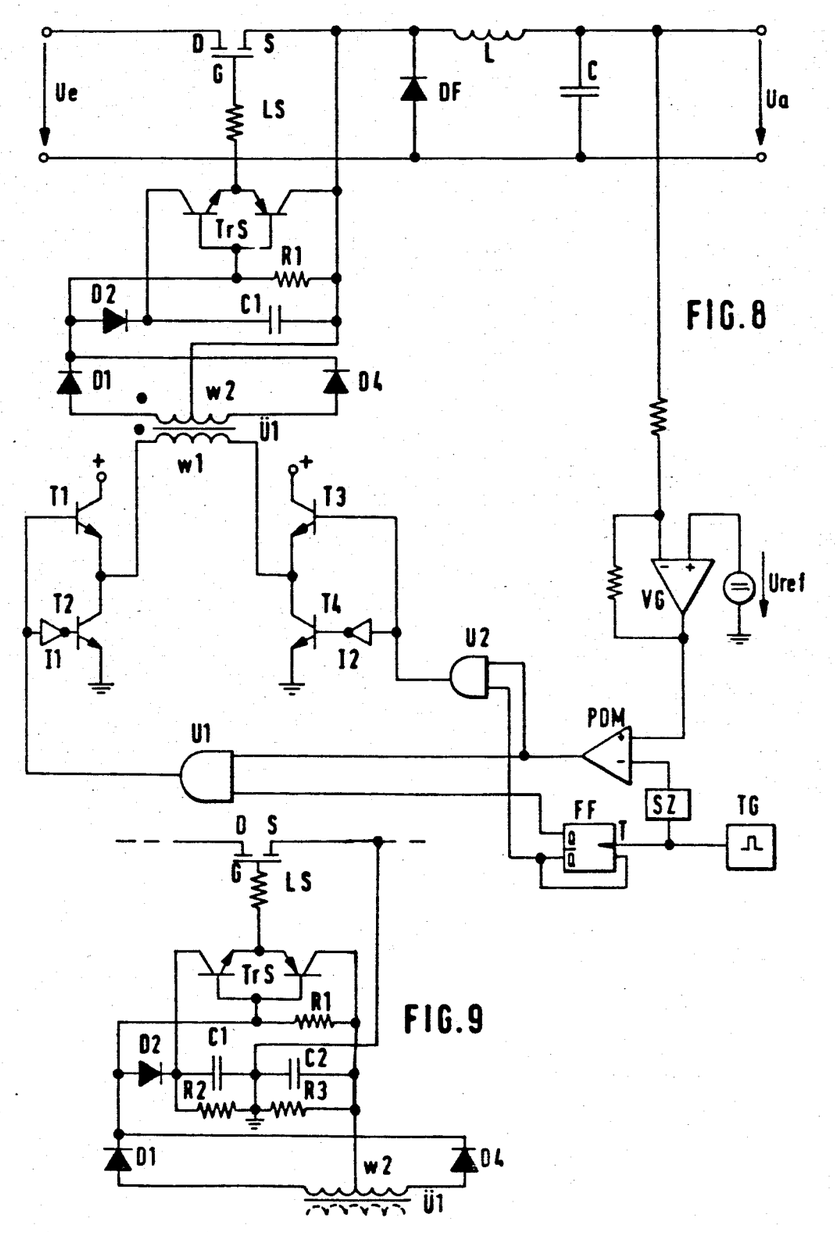
FIG. 8 shows an actuation circuit including a pulse transformer and center tap.
FIG. 9 shows an actuation circuit including a pulse transformer and center tap as well as symmetrical operation of the driver stage.

FIG. 8 shows an embodiment which likewise permits turn-on of the power switch LS with a keying ratio of from 0 to 1, but with the use of only one pulse transformer Ü1 whose secondary winding w2 has a center tap. Evaluation of the output voltage Ua as well as preparation of pulses having a 180° mutual phase shift by means of the switching logic including AND gates U1 and U2 and flip-flop FF, corresponds to that of the embodiment according to FIG. 5. The further processing of the output signals of the two AND gates U1 and U2 controls a switching bridge including transistors T1, T2, T3 and T4.

The output signal of gate U1 is fed directly to the base of T1 and via a signal inverter I1 to the base of T2. Likewise, the output signal of U2 is fed directly to the base of T3 and via a signal inverter I2 to the base of T4. The major or current carrying, electrodes of transistors T1 and and T2, that is the collector and emitter electrodes, are connected in series as are the electrodes of transistors T3 and T4. The common connection points of each pair of transistors, T1 and T2, and T3 and T4, of the switching bridge are connected together via the primary winding w1 of the pulse transformer Ü1. The ends of the secondary winding w2 of Ü1 are each connected with the anode of a respective one of the rectifier elements D1 and D4. The cathodes of elements D1 and D4 are connected together, and to the anode of element D2 and the base connection point of the push-pull driver stage TrS.

The center tap of the secondary winding w2 is connected to the terminal of charging capacitor C1 which faces away from element D2, to the base resistor R1, and to the source electrode S of the power switch LS.

FIG. 9 shows a circuit similar to that of FIG. 8 but with symmetrical operation of the push-pull driver stage TrS. A further charging capacitor C2 is connected in series with C1. Both charging capacitors C1 and C2 are again bridged by voltage divider elements R2, R3. The common connection point of C1 and C2 is connected to the source electrode S of power switch LS. The center tap of secondary winding w2 is connected to that terminal of charging capacitor C2 which is not connected to charging capacitor C1 and to the end of base resistor R1 facing away from the base connection point of driver stage TrS.

The potential free actuation circuit according to the present invention can be used for all types of direct voltage converters, for example for push-pull converters, flow-through converters, blocking converters, high and low setters, motor controls, inverters, etc.

Due to its reliability and simple design and consequently its low weight, the actuation circuit can be used for the current supply of satellites used for communications transmissions.

Figure 10:
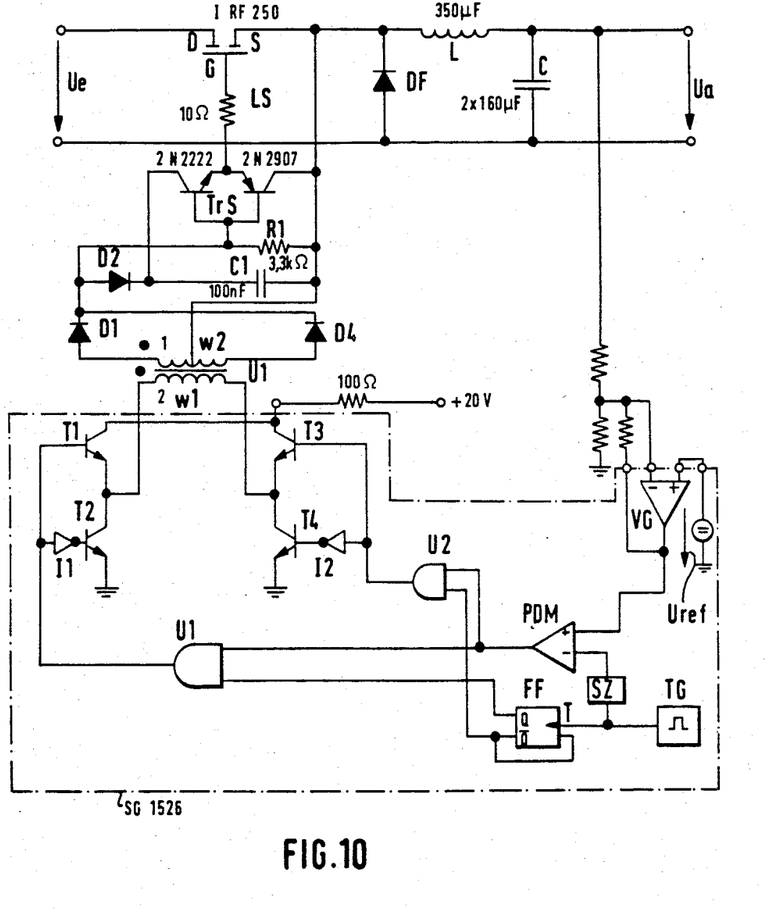
FIG. 10 shows a practically realized actuation circuit for use in a satellite.

A typical circuit arrangement for the actuation circuit is shown in FIG. 10. The actuation circuit there is proportioned as a buck regulator for an EPC (electrical power conditioner) for a TWTA (travelling wave tube amplifier) in a satellite. As for $U_e$, the input of the buck regulator, the main bus voltage of a satellite can be used. A typical range for $U_e$ will be 22 up to 100 volts. The output $U_a$ of the buck regulator is a stabilized voltage of e.g. 20 volts to feed the EPC. The circuitry of FIG. 10 is similar to that of FIG. 8. The following components are used: power switch LS—IRF 250, idling diode DF—1N 5814, smoothing choke L—inductivity of 350 μF, charging capacitor C—Zx 160 μF, gate resistor of LS—10Ω, transformation ratio of pulse transformer Ü1—w1:w2=2:1, driver stage TrS—transistors transistors 2N 2222 and 2N 2907, resistor R1—3,3k Ω, charging capacitor C1—100nF.

The components comparison stage VG, reference voltage Uref, pulse duration modulator PDM, Flip-Flop FF, sawtooth generator SZ, AND gates U1, U2, inverters I1 and I2, clock pulse generator TG and transistors T1, T2, T3 and T4 are part of an integrated circuit, framed in FIG. 10, manufactured by Silicon General under the name SG 1526. A common voltage supply of 20 volts for the transistors will be necessary and the output voltage $U_a$ is to be fed via a voltage divider. The clock pulse generator TG forming part of SG 1526 will preferably be adjusted to 50 kHz.

No other control signals are necessary to control switch LS. Only if switch LS could be damaged by a current from main bus voltage $U_e$ a current limiter is necessary. The keying ratio $$D = \frac{\text{turn-on time}}{\text{period duration}} \text{ is given by}$$

$$D = \frac{U_a}{U_e} = \frac{\text{output voltage}}{\text{input voltage}}.$$

It will be understood that the above description of the present invention is susceptible to various modifications, changes and adaptations, and the same are intended to be comprehended within the meaning and range of equivalents of the appended claims.

What is claimed is:

1. In a potential free actuation circuit for a pulse duration controlled electronic power switch having two major electrodes, said circuit comprising: a driver stage having a control input and first and second major electrodes; a first pulse transformer having a primary winding and a secondary winding, said secondary winding having first and second terminals; a pulse duration modulation stage having an output connected to said primary winding; a first rectifier element connected between said first terminal of said secondary winding and said control input of said driver stage; a second rectifier element connected between said first element and said first major electrode of said driver stage, with said first and second rectifier elements being poled in the same direction with respect to current flow through said first element; and a first charging capacitor connected between the side of said second rectifier element facing away from said first rectifier element and a major electrode of the power switch, the improvement wherein: the side of said second rectifier element which is remote from said first major electrode of said driver stage is conductively connected to a circuit point at which said first element is conductively connected to said control input of said driver stage; and said cirucit further comprises: a resistor connected between said control input of said driver stage and said second major electrode of said driver stage.

2. Actuation circuit as defined in claim 1 wherein said driver stage comprises a bipolar push-pull stage having transistors of respectively opposite polarities in emitter follower connection and having their base terminals connected together.

3. Actuation circuit as defined in claim 1 wherein said driver stage comprises Darlington transistors with respectively opposite polarities.

4. In a potential free actuation circuit for a pulse duration controlled electronic power switch having two major electrodes, said circuit comprising: a driver stage having a control input and first and second major electrodes; a first pulse transformer having a primary winding and a secondary winding, said secondary winding having first and second terminals; a pulse duration modulation stage having an output connected to said primary winding; a first rectifier element connected between said first terminal of said secondary winding and said control input of said driver stage; a second rectifier element connected between said first element and said first major electrode of said driver stage, with said first and second rectifier elements being poled in the same direction with respect to current flow through said first element; and a first charging capacitor connected between the side of said second rectifier element facing away from said first rectifier element and a major electrode of the power switch, the improvement wherein: the side of said second rectifier element which is remote from said first major electrode of said driver stage is conductively connected to a circuit point at which said first element is conductively connected to said control input of said driver stage; and said circuit further comprises: a resistor connected between said control input of said driver stage and said second major electrode of said driver stage; a second pulse transformer having a primary winding and a secondary winding, with said pulse duration modulation stage being connected to said primary winding of said second transformer for actuating said second transformer in phase opposition to said first transformer; and a third rectifier element connected between said secondary winding of said second transformer and the point of connection between said first and second rectifier elements, with said thrid rectifier element being poled relative to said secondary winding of said second transformer in the same manner that said first rectifier element is poled relative to said secondary winding of said first transformer.

5. In a potential free actuation circuit for a pulse duration controlled electronic power switch having two major electrodes, said circuit comprising: a driver stage having a control input and first and second major electrodes; a first pulse transformer having a primary winding and a secondary winding, said secondary winding having first and second terminals; a pulse duration modulation stage having an output connected to said primary winding; a first rectifier element connected between said first terminal of said secondary winding and said control input of said dirver stage; a seocnd rectifier element connected between said first element and said first major electrode of said driver stage, with said first and second rectifier elements being poled in the same direction with respect to current flow through said first element; and a first charging capacitor connected between the side of said second rectifier element facing away from said first rectifier element and a major electrode of the power switch, the improvement wherein: the side of said second rectifier element which is remote from said first major electrode of said driver stage is conductively connected to a circuit point at which said first element is conductively connected to said control input of said driver stage; and said circuit further comprises: a resistor connected between said control input of said driver stage and said second major electrode of said driver stage; a second pulse transformer having a primary winding and a secondary winding, with said pulse duration modulation stage being connected to said primary winding of said second transformer for actuating said second transformer in phase opposition to said first transformer; a third rectifier element connected between said secondary winding of said second transformer and the point of connection between said first and second rectifier elements, with said third rectifier element being poled relative to said secondary winding of said second transformer in the same manner that said first rectifier element is poled relative to said secondary winding of said first transformer; and additional rectifier elements connected between said secondary winding of each said pulse transformer and said charging capacitor and poled in the forward direction for the demagnetization current of each said pulse transformer, in such a manner than recharging of said charging capacitor is effected by the demagnetization current of said pulse transformers.

6. In a potential free actuation circuit for a pulse duration controlled electronic power switch having two major electrodes, said circuit comprising: a driver stage having a control input and first and second major electrodes; a first pulse transformer having a primary winding and a secondary winding, said secondary winding having first and second terminals; a pulse duration modulation stage having an output connected to said primary winding; a first rectifier element connected between said first terminal of said secondary winding and said control input of said driver stage; a second rectifier element connected between said first element and said first major electrode of said driver stage, with said first and second rectifier elements being poled in the same direction with respect to current flow through said first element; and a first charging capacitor connected between the side of said second rectifier element facing away from said first rectifier element and a major electrode of the power switch, the improvement wherein: the side of said second rectifier element which is remote from said first major electrode of said driver stage is conductively connected to a circuit point at which said first element is conductively connected to said control input of said driver stage; and said secondary winding of said first pulse transformer has a center tap which is connected with that major electrode of the electronic power switch to which said charging capacitor is connected, and further comprising a resistor connected between said control input of said driver stage and said second major electrode of said driver stage; and a third rectifier element connected between the end of said first transformer secondary winding which faces away from said first rectifier element and the electrode of said first rectifier elements which faces away from said pulse transformer, such that said first and third rectifier elements form a half-bridge rectifier circuit.

7. In a potential free actuation circuit for a pulse duration controlled electronic power switch having two major electrodes, said circuit comprising: a driver stage having a control input and first and second major electrodes; a first pulse transformer having a primary winding and a secondary winding, said secondary winding having first and second terminals; a pulse duration modulation stage having an output connected to said primary winding; a first rectifier element connected between said first terminal of said secondary winding and said control input of said driver stage; a second rectifier element connected between said first element and said first major electrode of said driver stage, with said first and second rectifier elements being poled in the same direction with respect to current flow through said first element; and a first charging capacitor connected between the side of said second rectifier element facing away from said first rectifier element and a major electrode of the power switch, the improvement wherein: the side of said second rectifier element which is remote from said first major electrode of said driver stage is conductively connected to a circuit point at which said first element is conductively connected to said control input of said driver stage; and additional rectifier elements are connected between said secondary winding of said pulse transformer and said charging capacitor and poled in the forward direction for the demagnetization current of said pulse transformer, in such a manner that recharging of said charging capacitor is effected by the demagnetization current of said pulse transformer.

8. In a potential free actuation circuit for a pulse duration controlled electronic power switch having two major electrodes, said circuit comprising: a driver stage having a control input and first and second major electrodes; a first pulse transformer having a primary winding and a secondary winding, said secondary winding having first and second terminals; a pulse duration modulation stage having an output connected to said primary winding; a first rectifier element connected between said first terminal of said secondary winding and said control input of said driver stage; a second rectifier element connected between said first element and said first major electrode of said driver stage, with said first and second rectifier elements being poled in the same direction with respect to current flow through said first element; and a first charging capacitor connected between the side of said second rectifier element facing away from said first rectifier element and a major electrode of the power switch, the improvement wherein: the side of said second rectifier element which is remote from said first major electrode of said driver stage is conductively connected to a circuit point at which said first element is conductively connected to said control input of said driver stage; and said circuit further comprises: a resistor connected between said control input of said driver stage and said second major electrode of said driver stage; a second pulse transformer having a primary winding and a secondary winding, with said pulse duration modulation stage being connected to said primary winding of said second transformer for actuating said second transformer in phase opposition to said first transformer; a thrid rectifier element connected between said secondary winding of said second transformer and the point of connection between said first and second rectifier elements, with said third rectifier element being poled relative to said secondary winding of said second transformer in the same manner that said first rectifier element is poled relative to said secondary winding of said first transformer; a second charging capacitor connected in series with said first charging capacitor; and additional rectifier elements connected between said secondary winding of each said pulse transformer and said charging capacitors, and poled in the forward direction for the demagnetization current of each said pulse transformer, in such a manner that recharging of each said charging capacitor is effected by the demagnetization current of said pulse transformers.

9. In a potential free actuation circuit for a pulse duration controlled electronic power switch having two major electrodes, said circuit comprising: a driver stage having a control input and first and second major electrodes; a first pulse transformer having a primary winding and a secondary winding, said secondary winding having first and second terminals; a pulse duration modulation stage having an output connected to said primary winding; a first rectifier element connected between said first terminal of said secondary winding and said control input of said driver stage; a second rectifier element connected between said first element and said first major electrode of said driver stage, with said first and second rectifier elements being poled in the same direction with respect to current flow through said first element; and a first charging capacitor connected between the side of said second rectifier element facing away from said first rectifier element and a major electrode of the power switch, the improvement wherein: the side of said second rectifier element which is remote from said first major electrode of said driver stage is conductively connected to a circuit point at which said first element is conductively connected to said control input of said driver stage; and said circuit further comprises: a resistor connected between said control input of said driver stage and said second major electrode of said dirver stage; a second charging capacitor connected in series with said first charging capacitor; and a voltage divider bridging said charging capacitors and having a center tap connected to one major electrode of the power switch.

* * * * *